(12) United States Patent
Okita et al.

(10) Patent No.: US 7,538,804 B2
(45) Date of Patent: May 26, 2009

(54) SOLID STATE IMAGE PICK-UP DEVICE AND IMAGE PICK-UP SYSTEM

(75) Inventors: Akira Okita, Kanagawa-ken (JP); Hiroki Hiyama, Kanagawa-ken (JP); Hideaki Takada, Kanagawa-ken (JP)

(73) Assignee: Canon Kabushiki Kaisha, Tokyo (JP)

(*) Notice: Subject to any disclaimer, the term of this patent is extended or adjusted under 35 U.S.C. 154(b) by 557 days.

(21) Appl. No.: 11/041,728

(22) Filed: Jan. 25, 2005

(65) Prior Publication Data
US 2005/0168618 A1 Aug. 4, 2005

(30) Foreign Application Priority Data
Feb. 2, 2004 (JP) .............. 2004-025603

(51) Int. Cl.
H04N 5/217 (2006.01)
H04N 5/335 (2006.01)
H01L 23/552 (2006.01)
H04J 1/12 (2006.01)

(52) U.S. Cl. .............. 348/241; 348/316; 257/659; 370/201

(58) Field of Classification Search .............. 348/241, 348/308, 316; 257/659, 409, 503; 370/201
See application file for complete search history.

(56) References Cited

U.S. PATENT DOCUMENTS

| | | | | |
|---|---|---|---|---|
| 5,136,358 A | * | 8/1992 | Sakai et al. | 257/659 |
| 5,260,760 A | * | 11/1993 | Takanashi et al. | 348/307 |
| 6,188,094 B1 | | 2/2001 | Kochi et al. | 257/232 |
| 6,605,850 B1 | | 8/2003 | Kochi et al. | 257/431 |
| 6,670,990 B1 | | 12/2003 | Kochi et al. | 348/310 |
| 6,693,334 B2 | * | 2/2004 | Sasaki | 257/409 |

(Continued)

FOREIGN PATENT DOCUMENTS

| | | |
|---|---|---|
| JP | 9-246517 | 9/1997 |
| JP | 2002-151672 A | 5/2002 |
| JP | 2003-037178 A | 2/2003 |

OTHER PUBLICATIONS

Johns, D., et al., "*Analog Integrated Circuit Design*," John Wiley & Sons, Inc. (1997).

*Primary Examiner*—Nhan T Tran
(74) *Attorney, Agent, or Firm*—Fitzpatrick, Cella, Harper & Scinto

(57) ABSTRACT

A solid state image pick-up device has shields for suppressing deterioration in a ratio of an output signal to output noises caused by crosstalks, suppressing deterioration in a ratio of the output signal to output noises caused by a coupling capacity, and suppressing deterioration in a ratio of the output signal to output noises caused by imbalance is provided. Shielding lines 301, 302, and 303 are arranged in a layer to which output lines 210 and 220 belong. Shielding lines 304, 305, and 306 are arranged over the shielding lines 301, 302, and 303, respectively. Further, shielding pins 307, 308, and 309 are arranged between the shielding lines 301 and 304, between the shielding lines 302 and 305, and between the shielding lines 303 and 306, respectively. No shielding line is arranged over output lines 210 and 220. A structure is made to be plane-symmetrical with respect to a plane including a center line of the shielding line 301 and a plane including a center line of the shielding line 304.

11 Claims, 6 Drawing Sheets

U.S. PATENT DOCUMENTS

| | | | |
|---|---|---|---|
| 6,977,684 B1 * | 12/2005 | Hashimoto et al. | 348/294 |
| 2003/0164887 A1 | 9/2003 | Koizumi et al. | 348/308 |
| 2003/0193585 A1 * | 10/2003 | Ogura et al. | 348/272 |
| 2003/0218117 A1 | 11/2003 | Hiyama et al. | 250/208.1 |
| 2004/0065808 A1 | 4/2004 | Kochi et al. | 250/214.1 |
| 2004/0085465 A1 * | 5/2004 | Inui et al. | 348/241 |
| 2005/0098805 A1 | 5/2005 | Okita et al. | 257/292 |
| 2005/0166242 A1 | 7/2005 | Matsumoto et al. | 725/88 |
| 2005/0174552 A1 | 8/2005 | Takada et al. | 355/53 |
| 2005/0179796 A1 | 8/2005 | Okita et al. | 348/308 |

* cited by examiner

SOLID STATE IMAGE PICK-UP DEVICE AND IMAGE PICK-UP SYSTEM

BACKGROUND OF THE INVENTION

1. Field of the Invention

The invention relates to a solid state image pick-up device for photographing a still image or a motion image and outputting a still image signal or a motion image signal.

2. Related Background Art

Solid state image pick-up devices are mainly classified into a CCD sensor and a MOS type sensor. Generally, while the CCD sensor is excellent in its small amount of noises, it has such a drawback that electric power consumption is large. On the other hand, despite such an advantage of the MOS type sensor that its electric power consumption is much smaller than that of the CCD sensor, it generally has such a drawback that a noise amount is slightly large. However, there is a tendency toward a decrease in the noise amount in the MOS type sensor and it is expected that the MOS type sensor provides performance equivalent to or better than that of the CCD sensor in the future.

In the MOS type sensor, it is relatively easy to build in various functional circuits using MOS transistors. An amplifying type solid state image pick-up device having signal amplifying elements in pixels can be mentioned as such an example. In such an image pick-up device, there is liability to occurrence of noises called fixed pattern noises (FPN) which are caused by a variation in photodetectors and the amplifying elements constructing the pixels. As one of methods of correcting the fixed pattern noises, there is one whereby both of a dark state output (Vdark) and a light state output (Vsig) are read out from each pixel and a difference between them is used as a signal output. According to such a method, generally, two horizontal reading lines one for a dark signal and one for a light signal are necessary. Generally, the pixels of the odd-number designated pixels and the even-number designated pixels in the horizontal direction are simultaneously read out as Channel 1 and Channel 2, respectively, for the realization of a high processing speed. Therefore, in the case of using the lines for the dark signal (Vdark) and the lines for the light signal (Vsig), respectively, a total of four horizontal reading lines are needed.

FIG. 7 of JP-A-09-246517 shows an example of a circuit construction near horizontal reading lines of such an amplifying type solid state image pick-up device. The amplifying type solid state image pick-up device comprises: a pixel matrix 1 constructed by arranging amplifying type photoelectric converting elements in the row and column directions; horizontal reading lines 3 having, for example, a total of four wirings; a horizontal reading switch group 5; a capacitor group 7; a signal transfer switch group 9; a horizontal shift register 11; and an output amplifier group 12.

FIG. 5 is a diagram showing a schematic construction of the general MOS type sensor. The MOS type sensor comprises: a sensor array 100 in which a plurality of photoelectric converting elements 110 are two-dimensionally arranged; a vertical shift register circuit 120 for sequentially selecting rows of the photoelectric converting elements 110 from the sensor array 100; a line memory circuit 130 including signal charge holding capacities Cts for holding signal charges (S) serving as a photosignal and reset level (N) holding capacities Ctn for holding a reset level serving as a noise signal, respectively, from the photoelectric converting elements 110 of the selected row; a horizontal shift register circuit 140 for simultaneously selecting every two signal data among the signal data of one row held in the line memory circuit 130 by a transfer switch and transferring the selected signal data to a first photosignal side common output line (hereinafter, referred to as a first S output line) 210 and a first noise signal side common output line (hereinafter, referred to as a first N output line) 220 and also to a second photosignal side common output line (hereinafter, referred to as a second S output line) 230 and a second noise signal side common output line (hereinafter, referred to as a second N output line) 240; and first and second difference signal (S-N) reading circuits 150 for amplifying a first difference signal between the photosignal from the first S output line 210 and the noise signal from the first N output line 220 and a second difference signal between the photosignal from the second S output line 230 and the noise signal from the second N output line 240 and outputting the amplified signals, respectively.

The first difference signal is outputted from an output terminal (out1) 170 of the first difference signal reading circuit. The second difference signal is outputted from an output terminal (out2) 180 of the second difference signal reading circuit. The first S output line 210, the first N output line 220, the second S output line 230, and the second N output line 240 construct a common output line 160.

A wiring shape of a cross section near a cutting line 6-6 in FIG. 5 is as schematically shown in FIG. 6 in the conventional device. A cross sectional view of the first S output line 210, the first N output line 220, and their peripheries is shown here. As shown in FIG. 6, the first S output line 210 and the first N output line 220 are arranged in a same layer and a shielding line 901 is arranged between them. A shielding line 902 is arranged in a neighboring position of the left side of the first S output line 210. A shielding line 903 is arranged in a neighboring position of the right side of the first N output line 220. Further, a shielding plate 904 is provided under a region that covers a range from the shielding line 902 to the shielding line 903. The first S output line 210, the first N output line 220, the shielding lines 901, 902, and 903, and the shielding plate 904 show a similar layout and cross sectional shape wherever in a range from the left edge to the right edge of the common output line 160 they are arranged. Although not shown, a substrate is arranged under the shielding plate through an insulating layer. The substrate is generally a silicon substrate for forming a photoelectric converting portion.

As shown in FIG. 6, in the case where the shielding lines 901, 902, and 903, and the shielding plate 904 are provided, as shown at reference numeral 911, an electric line of force 911 which passes through a portion over the shielding line 901 is formed. Crosstalks are generated between the first S output line 210 and the first N output line 220 through the electric line of force 911. When the crosstalks are generated, a signal-to-noise ratio in an output of the S-N reading circuit 150 deteriorates.

Therefore, as described in David Johns, Ken Martin, "Analog Integrated Circuit Design", John Wiley & Sons, Inc., 1997, as shown in FIG. 7, there is a method whereby the whole periphery of the first S output line 210 (or the second S output line 230) and the whole periphery of the first N output line 220 (or the second N output line 240) are covered by a shielding plate 953.

However, in the construction shown in FIG. 7, the signal flowing in the first S output line 210 (or the second S output line 230) is attenuated by a coupling capacity between the first S output line 210 (or the second S output line 230) and the shielding plate 953. Similarly, the noises which pass through the first N output line 220 (or the second N output line 240) are attenuated by a coupling capacity between the first N output line 220 (or the second N output line 240) and the shielding plate 953. Since the first S output line 210 (or the second S output line 230) and the first N output line 220 (or the second N output line 240) extend from the left end to the right end of the image horizontal direction of the solid state image pick-up device, the coupling capacity is distributed over a long distance. A slight increase in coupling capacity per unit length largely increases the whole coupling capacity and a degree of attenuation due to it is remarkable. This is because the signal charges read out of the pixel are temporarily accumulated in the capacities Cts and Ctn and, thereafter, read out to the first S output line 210 (or the second S output line 230) and the first N output line 220 (or the second N output line 240). Assuming that parasitic capacitances at this time are set to Chs and Chn, the read-out charges are subjected to capacity division between Cts and Chs and between Ctn and Chn and attenuated to Cts/(Cts+Chs) time and Ctn/(Ctn+Chn) time, respectively.

Therefore, in the case where the user intends to obtain an output of a desired level from the output terminal 170 (or the output terminal 180) of the S-N reading circuit 150, an amplification factor of the S-N reading circuit 150 has to be raised. A level of noises which are generated in the S-N reading circuit 150 rises at the output terminal 170 (or the output terminal 180) of the S-N reading circuit 150. Thus, the signal-to-noise ratio at the output terminal 170 (or the output terminal 180) of the S-N reading circuit 150 deteriorates.

Inherently, the signal and noises generated in the photoelectric converting element 110 appear in the first S output line 210 (or the second S output line 230) and the noises generated in the same photoelectric converting element 110 appear in the first N output line 220 (or the second N output line 240). The noises appearing in the first S output line 210 (or the second S output line 230) and the noises appearing in the first N output line 220 (or the second N output line 240) are cancelled in the S-N reading circuit 150. Only the signal between the signal and noises generated in the photoelectric converting element 110 can be obtained at the output terminal 170 (or the output terminal 180) of the S-N reading circuit 150. However, if the coupling capacity between the first S output line 210 (or the second S output line 230) and the shielding line differs from that between the first N output line 220 (or the second N output line 240) and the shielding line, the level of the noises in an input of the S-N reading circuit 150 in the first S output line 210 (or the second S output line 230) differs from that in the first N output line 220 (or the second N output line 240). The noises appearing in the first S output line 210 (or the second S output line 230) and the noises appearing in the first N output line 220 (or the second N output line 240) cannot be cancelled in the S-N reading circuit 150. It is impossible to obtain only the signal between the signal and noises generated in the photoelectric converting element 110 at the output terminal 170 (or the output terminal 180) of the S-N reading circuit 150.

SUMMARY OF THE INVENTION

It is, therefore, an object of the invention to provide a solid state image pick-up device with shields which can suppress deterioration of a ratio of an output signal to output noises that is caused by crosstalks, suppress deterioration of a ratio of an output signal to output noises that is caused by a coupling capacity, and further, suppress deterioration of a ratio of an output signal to output noises that is caused by imbalance.

According to the invention, there is provided a solid state image pick-up device comprising: an array having one or more lines on each of which a plurality of photoelectric converting elements are arranged; a first output line for transmitting a first signal from the plurality of photoelectric converting elements belonging to a selected line; a second output line for transmitting a second signal from the plurality of photoelectric converting elements belonging to the selected line; and a differential circuit for receiving the first signal from the first output line, receiving the second signal from the second output line, and outputting a difference between the first signal and the second signal, wherein the first output line and the second output line are arranged on a first layer and shields for suppressing crosstalks between the first output line and the second output line are provided for a plurality of layers including the first layer.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Embodiments of the invention will be described in detail hereinbelow with reference to the drawings.

Figure 5:
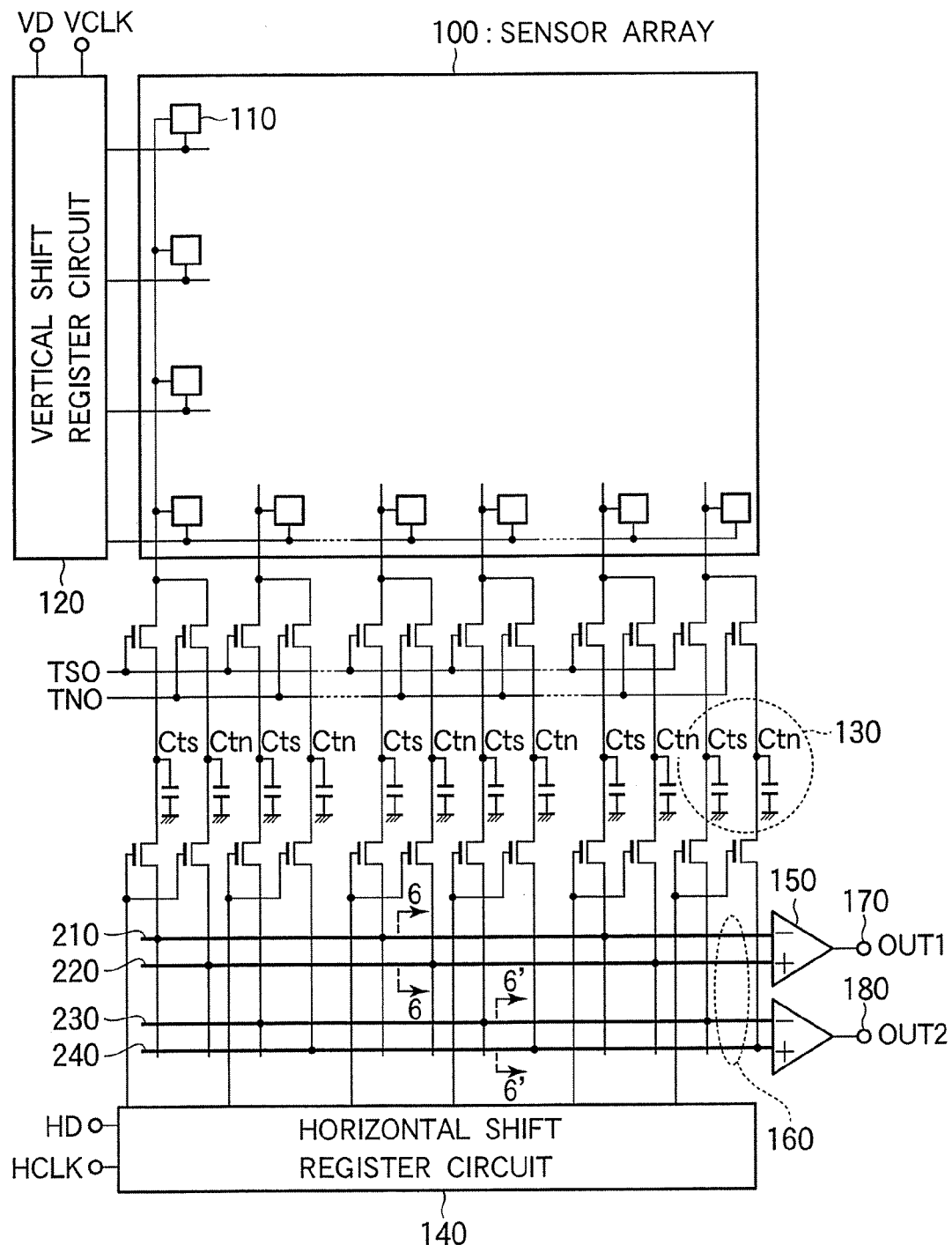
FIG. 5 is an equivalent circuit diagram showing the solid state image pick-up device.

Since a fundamental construction of a solid state image pick-up device according to each embodiment of the invention is similar to that shown in FIG. 5, its overlapped explanation is omitted here.

Figure 6:
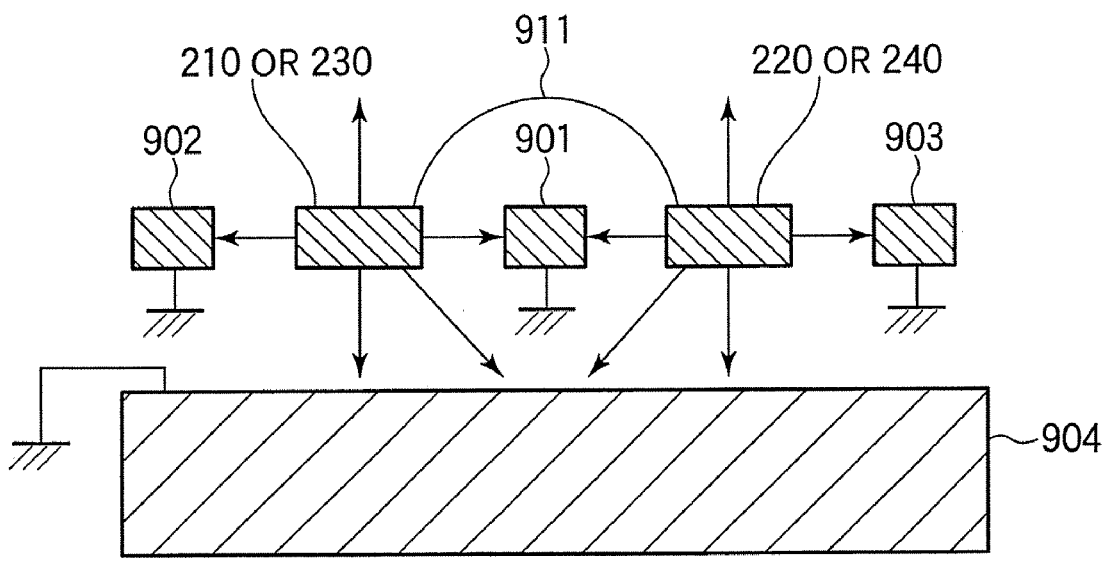
FIG. 6 is a cross sectional view showing a layout of output lines and shielding lines of a solid state image pick-up device according to a prior art taken along the line 6-6 in FIG. 5.
Figure 7:
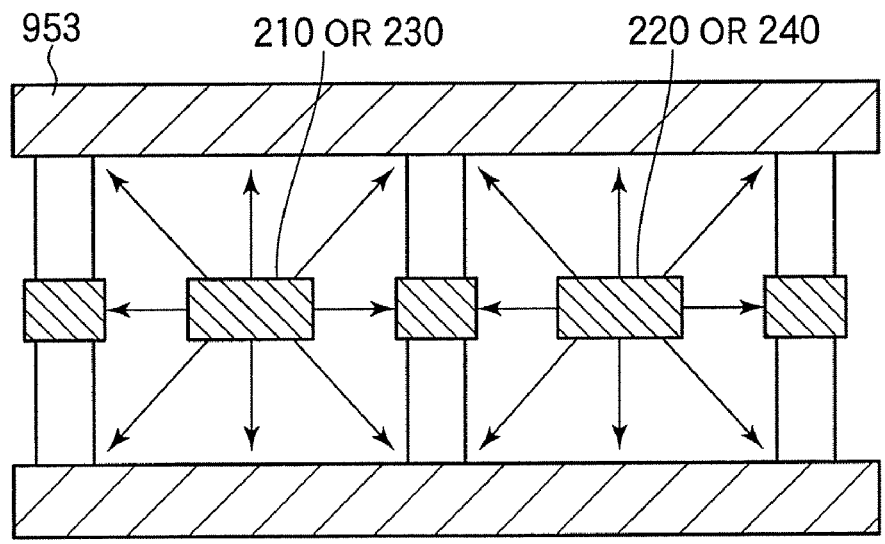
FIG. 7 is a cross sectional view showing a layout of output lines and shielding lines of a solid state image pick-up device according to another prior art.

In the embodiments, shields which are arranged around the first S output line 210 (or the second S output line 230) and the first N output line 220 (or the second N output line 240) differ from those shown in FIGS. 6 and 7.

Figure 1:
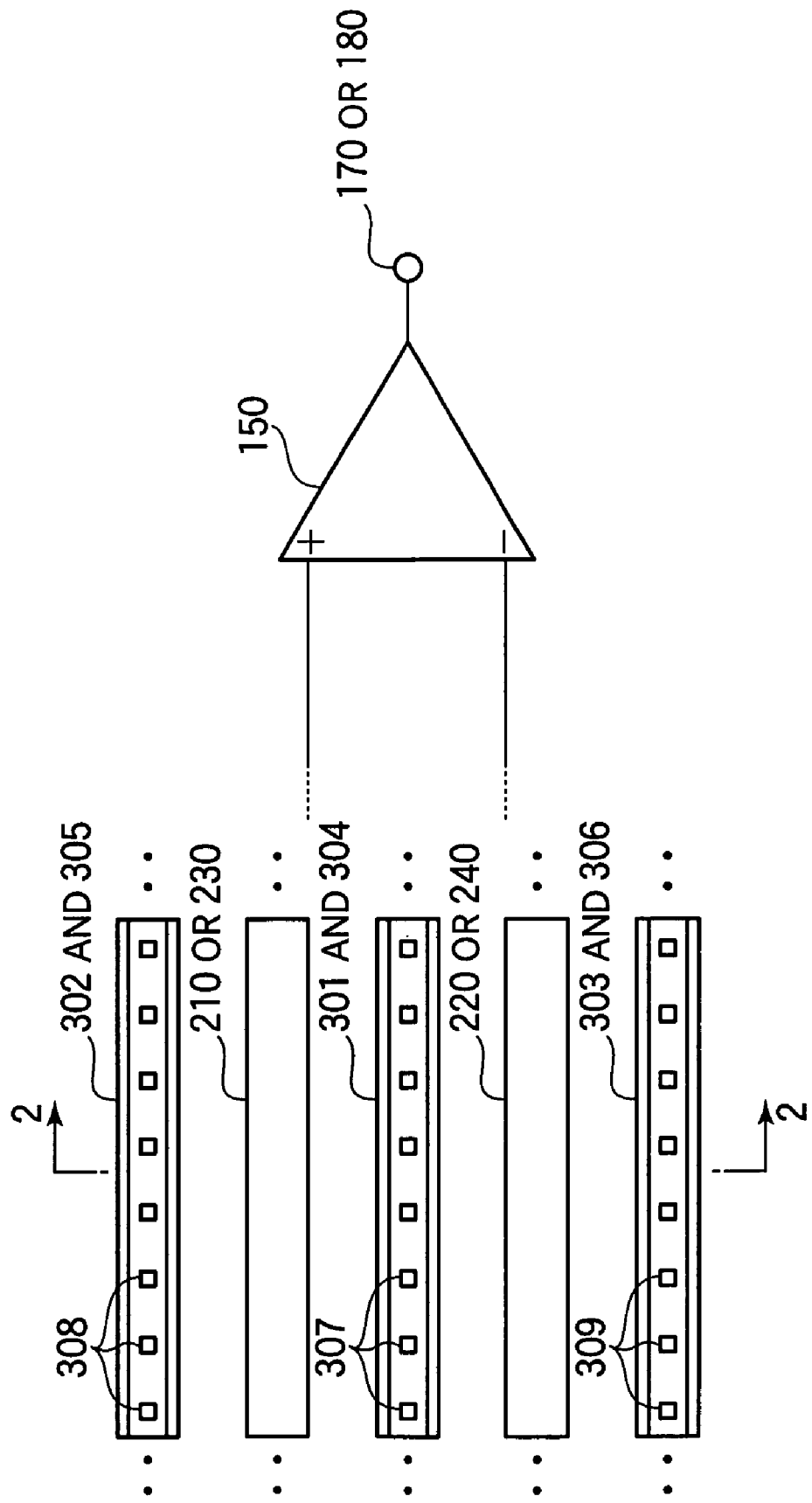
FIG. 1 is a plan view showing output lines, shielding lines, and shielding pins of a solid state image pick-up device according to an embodiment of the invention.
Figure 2:
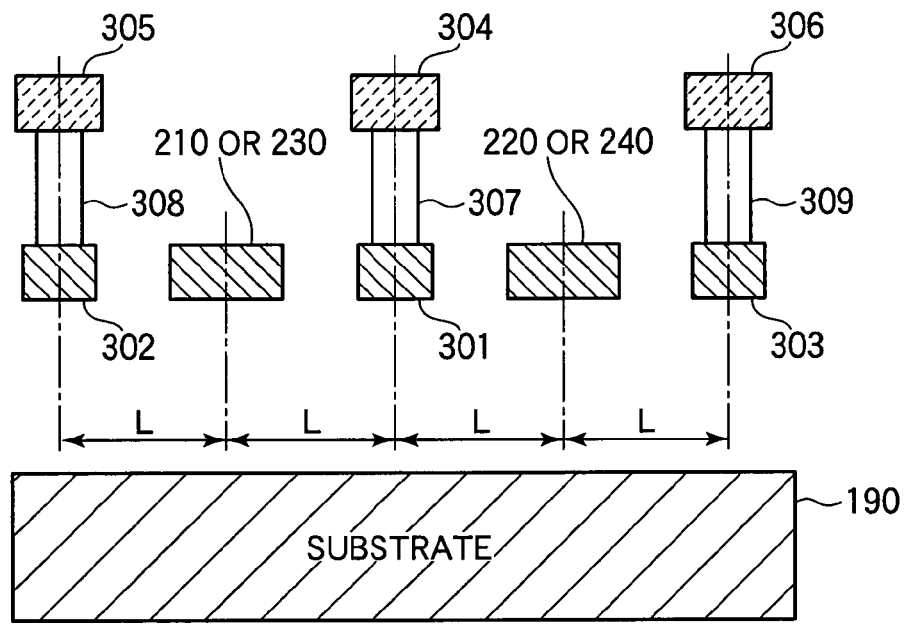
FIG. 2 is a cross sectional view showing the output lines, shielding lines, and shielding pins of the solid state image pick-up device according to the embodiment of the invention taken along the line 2-2 in FIG. 1.

FIG. 1 is a plan view showing the first S output line 210 (or the second S output line 230), the first N output line 220 (or the second N output line 240), and shields such as shielding lines arranged around those output lines and the like. FIG. 2 is a cross sectional view taken along the line 2-2 in FIG. 1.

An explanation will be made hereinbelow with respect to the first S output line 210 (the first N output line 220) and since the second S output line 230 (the second N output line 240) has a construction similar to that of the line 210 (line 230), its explanation is omitted here.

Referring now to FIGS. 1 and 2, the first S output line 210 and the first N output line 220 are arranged on a same layer (hereinafter, referred to as a "first layer"). A shielding line 301 is arranged between the first S output line 210 and the first N output line 220 of the first layer. A shielding line 302 is arranged on the left side of the first S output line 210 of the first layer. A shielding line 303 is arranged on the right side of the first N output line 220 of the first layer. In a photoelectric converting portion, the first layer is a wiring layer which forms a vertical signal line for transferring the signal to the first and second S output lines and the first and second N output lines.

A distance between the first S output line 210 and the shielding line 301 is equal to that between the first N output line 220 and the shielding line 301. A distance between the first S output line 210 and the shielding line 302 is equal to that between the first N output line 220 and the shielding line 303.

In a layer over the first layer (hereinbelow, such a layer is referred to as a "second layer"), shielding lines 304, 305, and 306 are arranged in the positions where the shielding lines 301, 302, and 303 are vertically projected, respectively. In the photoelectric converting portion, the shielding lines 304, 305, and 306 are formed mainly in the wiring layer to form a power line and a ground line.

The shielding lines 301 and 304 are discretely connected by a shielding pin 307. Similarly, the shielding lines 302 and 305 are discretely connected by a shielding pin 308. The shielding lines 303 and 306 are discretely connected by a shielding pin 309.

All of the shielding lines are connected to the ground or a constant voltage source whose output impedance is almost equal to zero. A material of each of the shielding lines 301 to 306 and the shielding pins 307 to 309 is a conductive substance (for example, aluminum, copper, etc.). The foregoing structure is formed on a substrate 190. The "substrate" used here denotes a silicon substrate or the like on which the photoelectric converting portion and the like have been formed.

Since not only the shielding lines 301, 302, and 303 but also the shielding lines 304, 305, and 306 are arranged, the crosstalks between the first S output line 210 and the first N output line 220 can be suppressed as compared with those in the case where only the shielding lines 301, 302, and 303 are arranged. Particularly, since the crosstalks caused by an electric line of force which passes through the position of the shielding line 304 that occupies almost of the crosstalks caused in the case where only the shielding lines 301, 302, and 303 are arranged are eliminated, the whole crosstalks can be suppressed. By providing the shielding pins, a part of the electric line of force which passes on the shielding lines can be shut off and the crosstalks which are caused by the electric line of force are eliminated, so that the whole crosstalks can be suppressed.

As will be obvious from the above description, in the second layer, no shielding line is formed in the position where the first S output line 210 has vertically been projected and the position where the first N output line 220 has vertically been projected. By constructing as mentioned above, in the second layer, as compared with the case where the shielding lines are arranged in the position where the first S output line 210 has vertically been projected and the position where the first N output line 220 has vertically been projected, the coupling capacity between the first S output line 210 and the shielding line and the coupling capacity between the first N output line 220 and the shielding line are deleted, so that an increase in whole coupling capacity caused by an increase in the number of shielding lines is minimized.

A plane including a center line of the shielding line 301 and a center line of the shielding line 304 is used as a reference, the first S output line 210 and the first N output line 220 are plane-symmetrically arranged, the shielding line 302 and the shielding line 303 are plane-symmetrically arranged, the shielding line 305 and the shielding line 306 are plane-symmetrically arranged, and the shielding pin 308 and the shielding pin 309 are plane-symmetrically arranged, respectively. By using such a plane-symmetrical construction as mentioned above, the coupling capacity between the first S output line 210 and the shielding line and that between the first N output line 220 and the shielding line can be equalized. Therefore, the level of the noises which are supplied from the first S output line 210 to the S-N reading circuit 150 and that of the noises which are supplied from the first N output line 220 to the S-N reading circuit 150 can be equalized. The deterioration in signal-to-noise ratio caused by imbalance of the noises can be prevented.

Figure 3:
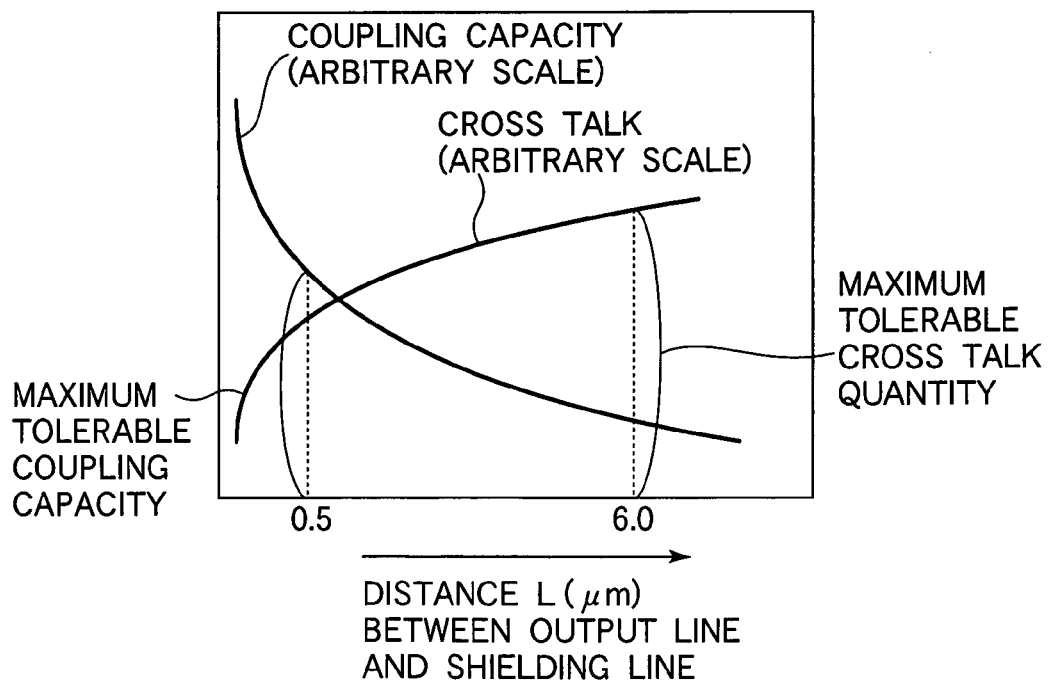
FIG. 3 is a graph showing a relation of a distance between the output line and the shielding line to crosstalks and a relation of a distance between the output line and the shielding line to a coupling capacity.

FIG. 3 is a graph showing the coupling capacity between the output line and the shielding line in the case where a distance L between the output line and the shielding line shown in FIG. 2 is used as a parameter and a quantity of crosstalks between the first S output line 210 and the first N output line 220. As will be obvious from FIG. 3, when the distance L is equal to 0.5 μm or more, since the coupling capacity which is demanded to be smaller is equal to or less than the maximum tolerable coupling capacity, it is desirable to set the distance L to 0.5 μm or more. If the distance L is equal to 6.0 μm or less, since the crosstalk quantity which is desired to be smaller is equal to or less than the maximum tolerable crosstalk quantity, it is desirable to set the distance L to 6.0 μm or less. It is, therefore, preferable to set the distance L to a value within a range from 0.5 μm to 6.0 μm.

Figure 4:
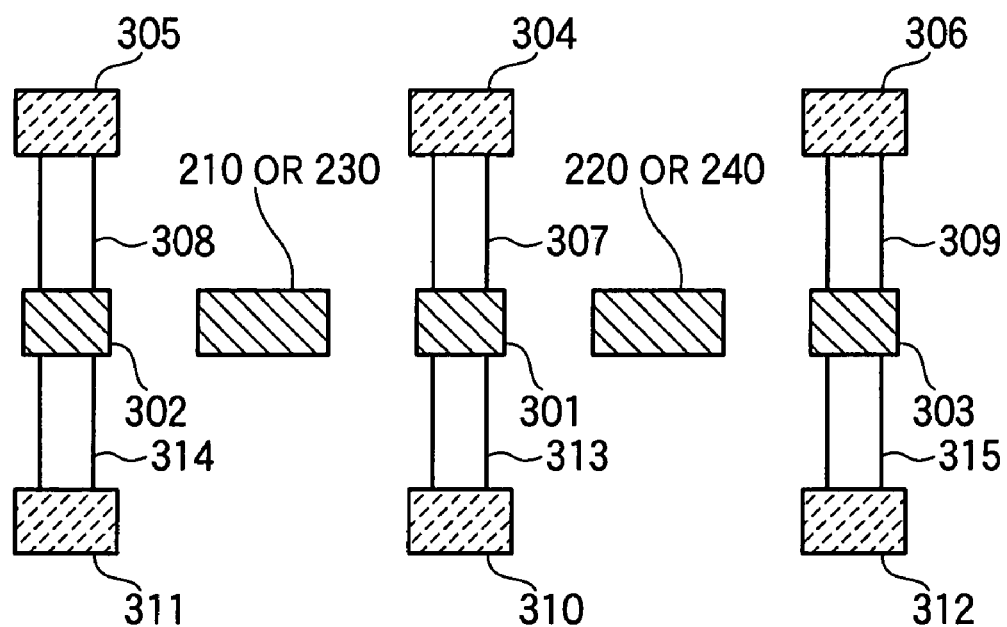
FIG. 4 is a cross sectional view showing output lines, shielding lines, and shielding pins of a solid state image pick-up device according to another embodiment of the invention.

FIG. 4 shows an embodiment in which further other shielding lines and shielding pins are added to the shielding lines and shielding pins shown in FIGS. 1 and 2. Referring to FIG. 4, in a layer under the first layer (hereinafter, such a layer is referred to as a "third layer"), shielding lines 310, 311, and 312 are arranged in the positions where the shielding lines 301, 302, and 303 have vertically been projected, respectively.

The shielding lines 301 and 310 are discretely connected by a shielding pin 313. Similarly, the shielding lines 302 and 311 are discretely connected by a shielding pin 314. The shielding lines 303 and 312 are discretely connected by a shielding pin 315.

A material of each of the shielding lines 310 to 312 and the shielding pins 313 to 315 is a conductive substance (for example, aluminum, copper, etc.).

According to the embodiment shown in FIG. 4, as compared with the embodiment shown in FIGS. 1 and 2, since the shielding lines and the shielding pins are added, the crosstalks can be further suppressed.

According to the embodiment shown in FIG. 4, in a manner similar to the embodiment shown in FIGS. 1 and 2, in the third layer, no shielding line is arranged in the position where the first S output line 210 has vertically been projected and the position where the first N output line 220 has vertically been projected. By constructing as mentioned above, in the third layer, as compared with the case where the shielding lines are arranged in the position where the first S output line 210 has vertically been projected and the position where the first N output line 220 has vertically been projected, the coupling capacity between the first S output line 210 and the shielding line and the coupling capacity between the first N output line 220 and the shielding line are deleted, so that an increase in whole coupling capacity caused by an increase in the number of shielding lines is minimized.

As will be obvious from the above description, the plane including the center line of the shielding line 301 and the center line of the shielding line 304 is used as a reference, the first S output line 210 and the first N output line 220 are plane-symmetrically arranged, the shielding line 302 and the shielding line 303 are plane-symmetrically arranged, the shielding line 305 and the shielding line 306 are plane-symmetrically arranged, the shielding pin 308 and the shielding pin 309 are plane-symmetrically arranged, the shielding line 311 and the shielding line 312 are plane-symmetrically arranged, and the shielding pin 314 and the shielding pin 315 are plane-symmetrically arranged, respectively. By using such a plane-symmetrical construction as mentioned above, the coupling capacity between the first S output line 210 and the shielding line and that between the first N output line 220 and the shielding line can be equalized. Therefore, the level of the noises which are supplied from the first S output line 210 to the S-N reading circuit 150 and that of the noises which are supplied from the first N output line 220 to the S-N reading circuit 150 can be equalized. The deterioration in signal-to-noise ratio caused by imbalance of the noises can be prevented.

Although the above embodiment has been described on the assumption that a plurality of lines each of which is constructed by a plurality of photoelectric converting elements 110 are arranged in the sensor array 100, only one such line can be also arranged in the sensor array 100.

The above embodiment has been described with respect to the construction of the solid state image pick-up device comprising: the first output line for transmitting the first signal from the plurality of photoelectric converting elements belonging to the selected line; the second output line for transmitting the second signal from the plurality of photoelectric converting elements belonging to the selected line; and the differential circuit for receiving the first signal from the first output line, receiving the second signal from the second output line, and outputting the difference between the first signal and the second signal, wherein the first output line and the second output line are arranged on the first layer, and the shields for suppressing the crosstalks between the first output line and the second output line are provided for the plurality of layers including the first layer. However, the advantage of the construction in which the shields are provided for the plurality of layers is not limited to such a construction.

For example, similar effects are also obtained in a construction of a solid state image pick-up device comprising: an array having a plurality of lines on each of which a plurality of photoelectric converting elements are arranged; a first output line for transmitting a first signal from the plurality of photoelectric converting elements belonging to a selected line; and a second output line for transmitting a second signal from the plurality of photoelectric converting elements belonging to a line different from the selected line, wherein the first output line and the second output line are arranged on a first layer and shields for suppressing crosstalks between the first output line and the second output line are provided for a plurality of layers including the first layer. That is, in the construction in which the signals from the photoelectric converting elements of the array are read out separately from a plurality of horizontal signal lines (a plurality of channels), there is an effect of suppressing the crosstalks between the first horizontal signal line and the second horizontal signal line. Also in this construction, it is desirable to arrange the shields in the positions excluding the position where the first output line has vertically been projected and the position where the second output line has vertically been projected. Further, it is desirable that the shields have at least the first portion arranged between the first output line and the second output line and the first output line and the second output line are plane-symmetrically arranged while using the first portion as a reference.

<Application to a Digital Camera>

Figure 8:
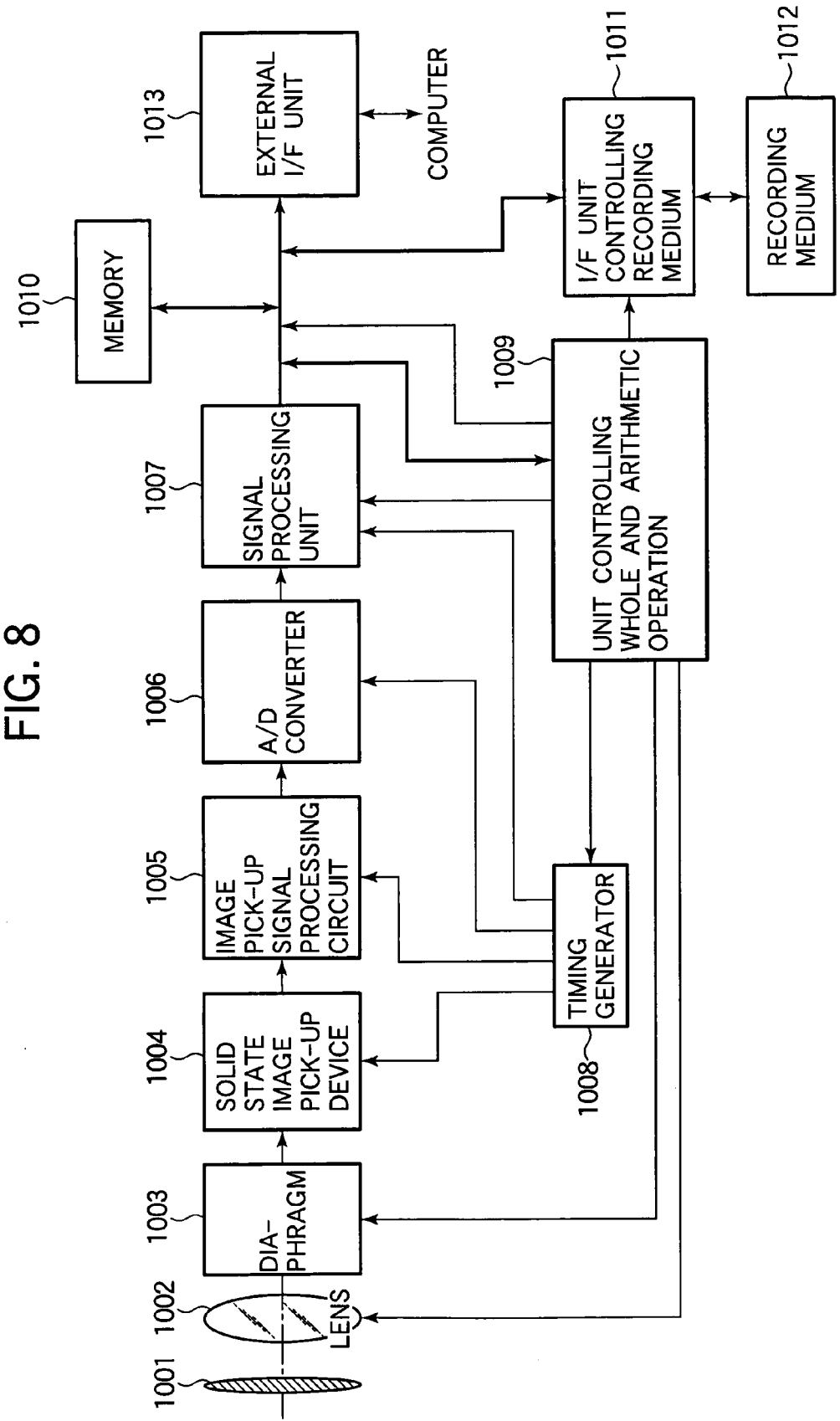
FIG. 8 is a block diagram schematically showing a solid state image pick-up device utilized in a camera, according to a embodiment of the invention.

FIG. 8 shows an example of a circuit block in the case of applying the solid state image pick-up device according to the invention to a camera. A shutter 1001 is disposed in front of a photographing lens 1002 and controls exposure. A light quantity is controlled as necessary by a diaphragm 1003, thereby forming an image onto a solid state image pick-up device 1004. A signal outputted from the solid state image pick-up device 1004 is processed by an image pick-up signal processing circuit 1005 and converted from an analog signal into a digital signal by an A/D converter 1006. The outputted digital signal is further arithmetically processed by a signal processing circuit 1007. The processed digital signal is stored into a memory 1010 or transmitted to an external apparatus through an external I/F unit 1013. The solid state image pick-up device 1004, image pick-up signal processing circuit 1005, A/D converter 1006, and signal processing circuit 1007 are controlled by a timing generator 1008. The whole system is controlled by a unit 1009 controlling whole and arithmetic operation. To record an image onto a recording medium 1012, the output digital signal is recorded through an I/F unit 1011 controlling the recording medium which is controlled by the unit 1009 controlling whole and arithmetic operation.

This application claims priority from Japanese Patent Application No. 2004-025603 filed Feb. 2, 2004, which is hereby incorporated by reference herein.

What is claimed is:

1. A solid state image pick-up device comprising:
    an array having a plurality of lines on which a plurality of photoelectric converting elements are arranged;
    a first output line for capacitively holding and then transmitting a first signal from a plurality of photoelectric converting elements belonging to a selected line;
    a second output line for capacitively holding and then transmitting a second signal from said plurality of photoelectric converting elements belonging to said selected line; and
    a differential circuit for receiving said first signal from said first output line, receiving said second signal from said second output line, and outputting a difference between said first signal and said second signal,
    wherein said first output line and said second output line are arranged on a first layer, and shields for suppressing crosstalk between said first output line and said second output line are arranged in a plurality of layers including said first layer and a second layer on which said first and second output lines are not arranged, and
    wherein, in at least one layer different from said first layer, said shields are arranged in positions excluding a position where said first output line vertically projects and a position where said second output line vertically projects.

2. A device according to claim 1, wherein
said shields have at least a first portion arranged between said first output line and said second output line, and
said first output line and said second output line are plane-symmetrically arranged, with said first portion being used as a reference.

3. A device according to claim 2, wherein a distance between said first output line and said first portion and a distance between said second output line and said first portion lie within a range of from 0.5 µm to 6 µm.

4. A device according to claim 3, wherein
said shields have a second portion in a direction opposite to a direction in which said first portion is seen from said first output line,
said shields have a third portion in a direction opposite to a direction in which said first portion is seen from said second output line, and
a distance between said first output line and said second portion and a distance between said second output line and said third portion lie within a range of from 0.5 µm to 6 µm.

5. A device according to claim 1,
wherein said shields are first shields, and wherein said device further comprises second shields, which are arranged between different layers of said first shields.

6. A solid state image pick-up device according to claim 1, wherein said device is incorporated in an image pick-up system that includes:
an optical system for forming an image of light onto said solid state image pick-up device; and
a signal processing circuit for processing an output signal from said solid state image pick-up device.

7. A device according to claim 1, wherein said first and second signals are capacitively held, and then transferred from said first and second output lines through a switch to said differential circuit simultaneously.

8. A solid state image pick-up device comprising:
an array having a plurality of lines on which a plurality of photoelectric converting elements are arranged;
a first output line for capacitively holding and then transmitting a first signal from a plurality of photoelectric converting elements belonging to a selected line; and
a second output line for capacitively holding and then transmitting a second signal from said plurality of photoelectric converting elements belonging to a line different from said selected line,
wherein said first output line and said second output line are arranged on a first layer, and shields for suppressing crosstalk between said first output line and said second output line are arranged in a plurality of layers including said first layer and a second layer on which said first and second output lines are not arranged, and
wherein, in at least one layer different from said first layer, said shields are arranged in positions excluding a position where said first output line vertically projects and a position where said second output line vertically projects.

9. A device according to claim 8, wherein
said shields have at least a first portion arranged between said first output line and said second output line, and
said first output line and said second output line are plane-symmetrically arranged, with said first portion being used as a reference.

10. A solid state image pick-up device according to claim 8, wherein said device is incorporated in an image pick-up system that includes:
an optical system for forming an image of light onto said solid state image pick-up device; and
a signal processing circuit for processing an output signal from said solid state image pick-up device.

11. A device according to claim 8, wherein said first and second signals are capacitively held, and then simultaneously transferred from said first and second output lines through a switch to a differential circuit.

\* \* \* \* \*